(12) United States Patent
Hu et al.

(10) Patent No.: US 7,879,732 B2
(45) Date of Patent: Feb. 1, 2011

(54) THIN FILM ETCHING METHOD AND SEMICONDUCTOR DEVICE FABRICATION USING SAME

(75) Inventors: Xiang Hu, Singapore (SG); Hai Cong, Singapore (SG); Pradeep Yelehanka, Singapore (SG); Mei Sheng Zhou, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 647 days.

(21) Appl. No.: 11/959,034

(22) Filed: Dec. 18, 2007

(65) Prior Publication Data

US 2009/0156010 A1 Jun. 18, 2009

(51) Int. Cl.
*H01L 21/302* (2006.01)
*G01R 31/00* (2006.01)
*B44C 1/22* (2006.01)

(52) U.S. Cl. ............................ 438/714; 438/9; 216/60
(58) Field of Classification Search .............. 438/714, 438/710, 14, FOR. 101, FOR. 142, 7–9, 16, 438/905; 216/6, 37, 58, 59, 63, 67, 60; 702/170, 702/FOR. 148; 257/E21.528
See application file for complete search history.

(56) References Cited

U.S. PATENT DOCUMENTS

| | | | |
|---|---|---|---|
| 5,405,488 A | 4/1995 | Dimitrelis et al. | |
| 5,652,177 A | 7/1997 | Pan | |
| 5,712,702 A * | 1/1998 | McGahay et al. | ........... 356/311 |
| 5,843,847 A | 12/1998 | Pu et al. | |
| 5,879,574 A | 3/1999 | Sivaramakrishnan et al. | |
| 5,935,340 A | 8/1999 | Xia et al. | |
| 5,948,700 A | 9/1999 | Zheng et al. | |
| 6,074,954 A | 6/2000 | Lill et al. | |
| 6,124,927 A * | 9/2000 | Zhong et al. | ................. 356/311 |
| 6,207,533 B1 | 3/2001 | Gao | |
| 6,228,277 B1 | 5/2001 | Kornblit et al. | |
| 6,300,251 B1 | 10/2001 | Pradeep et al. | |
| 6,347,636 B1 | 2/2002 | Xia et al. | |
| 6,406,924 B1 | 6/2002 | Grimbergen et al. | |
| 6,419,846 B1 | 7/2002 | Toprac et al. | |
| 6,444,037 B1 | 9/2002 | Frankel et al. | |
| 6,564,114 B1 | 5/2003 | Toprac et al. | |
| 6,582,618 B1 | 6/2003 | Toprac et al. | |
| 6,626,185 B2 * | 9/2003 | Demos et al. | ................. 134/1.1 |
| 6,633,391 B1 | 10/2003 | Oluseyi et al. | |
| 6,776,851 B1 | 8/2004 | Singh et al. | |
| 6,794,303 B2 | 9/2004 | Haselden et al. | |
| 6,806,949 B2 | 10/2004 | Ludviksson et al. | |
| 6,815,362 B1 | 11/2004 | Wong et al. | |
| 6,924,191 B2 | 8/2005 | Liu et al. | |
| 6,994,769 B2 * | 2/2006 | Singh et al. | ............ 156/345.51 |

(Continued)

*Primary Examiner*—Shamim Ahmed
*Assistant Examiner*—Patti Lin
(74) *Attorney, Agent, or Firm*—Brinks Hofer Gilson & Lione

(57) ABSTRACT

A method for etching a thin film and fabricating a semiconductor device includes etching the thin film on a substrate, while monitoring the removal of an endpoint detection layer remotely located from the substrate, such that precise control of the thin film etching is provided by monitoring the removal of the endpoint detection layer. The endpoint detection layer is formed on a surface of an etching apparatus that is exposed to the same etching conditions as the thin film to be etched. The etching of the thin film is stopped when a predetermined amount of the endpoint detection layer has removed from the surface of the etching apparatus.

24 Claims, 5 Drawing Sheets

U.S. PATENT DOCUMENTS

| | | |
|---|---|---|
| 7,009,281 B2 | 3/2006 | Bailey, III et al. |
| 7,094,613 B2 | 8/2006 | Mui et al. |
| 7,099,013 B2 | 8/2006 | Katz et al. |
| 7,199,328 B2 | 4/2007 | Strang |
| 2002/0153030 A1 | 10/2002 | Chooi et al. |
| 2003/0092281 A1 | 5/2003 | Ramachandramurthy et al. |
| 2009/0104719 A1* | 4/2009 | Gupta et al. .......... 438/7 |

* cited by examiner

THIN FILM ETCHING METHOD AND SEMICONDUCTOR DEVICE FABRICATION USING SAME

TECHNICAL FIELD

The present invention relates, generally, to methods of fabricating semiconductor devices and, more particularly, to thin film etching methods using optical endpoint detection systems.

BACKGROUND

As semiconductor devices continue to be scaled to smaller and smaller dimensions, the thickness of the various layers used to fabricate the devices is also reduced. The precise etching of very thin device layers is challenging given the current etching technology. The endpoint detection systems used in etching apparatus must terminate the etching process at exactly the precise point that the device layer is removed. Over-etching of the device layer can result in damage to underlying surfaces, which can degrade device performance.

Shown in FIG. 1, in cross-section, is a MOS transistor 10 including a gate electrode 11 overlying a semiconductor substrate 12. A gate dielectric layer 14 separates gate electrode 11 from substrate 12. Sidewall spacers 16 reside adjacent to edges 18 of gate electrode 11. The structure illustrated in FIG. 1, is conventionally formed by growing an oxide layer on a principal surface 20 of substrate 12 to form gate dielectric layer 14. A layer of polycrystalline silicon is deposited on gate dielectric layer 14. The polycrystalline silicon is lithographically patterned and anisotropically etched to form gate electrode 11 having substantially vertical edges 18. The dielectric layer is also etched, such that portions of the dielectric layer exposed by gate electrode 11 are removed. Then, the lithographic pattern is removed and a layer of insulating material, such as silicon oxide or silicon nitride, is conformally deposited on gate electrode 11. To form sidewall spacers 16, the insulating material is anisotropically etched in a plasma etching apparatus (not shown) to remove portions of the insulating material overlying horizontal surfaces, such as upper surface 22 of gate electrode 11, but leaving insulating material on vertical surfaces, such as edges 18.

To avoid creating problems during subsequent fabrication steps used to manufacture devices, such as integrated circuits, and the like, it is important that all of the insulating material be removed from principal surface 20 during the sidewall spacer etching process. To insure that the insulating material is removed, an over-etching process is used in which the etching process is carried out for an extended amount of time beyond that necessary to just remove the insulating material. During the over-etching process, a portion of substrate 12 is also etched. This results in the formation of a recess 24 in the surface of substrate 12. The recess is shown in FIG. 1 as the region between the extended portions of principal surface 20 (indicated by dashed lines) and an etched surface 26 of substrate 12.

In advanced fabrication technology, the dimensions of device features such as gate electrode 11 are exceedingly small and the layers used to form the devices are very thin. For example, a typical deposited thickness of the insulating material used to form sidewall spacers 16 is on the order of 10 nm. With such a thin layer of insulating material to be etched, it is very difficult to precisely control the anisotropic etching process in a way that avoids substrate surface recessing, such as that shown in FIG. 1. When a recess is formed, such as recess 24, unwanted substrate surface features 28 are created near channel region 29, which underlies gate electrode 11 in substrate 12. The proximity of surface features 28 to channel region 29 can create disturbance in the electric fields created in channel region 29 during operation of MOS transistor 10.

Typically, the etching process used to form sidewall spacers 16 is controlled by an optical endpoint detection system employing either optical emission spectroscopy (OES) or optical reflection. The endpoint detection system is electrically coupled to control systems in the etching apparatus. In an OES system, the endpoint detection system monitors emission spectrum of the plasma during the etching process and signals the etch control system to stop when a set-point detection limit is reached. The sensitivity level needed to detect the removal of insulating material and the exposure of the underlying substrate surface is within the noise level of the system. Numerous commercial plasma etching apparatus having optical endpoint detection systems using OES technology are readily available and well known in the art.

In an optical reflection system, an optical signal is reflected from the surface of the insulating material. With very thin layers, such as the insulating material used to form sidewall spacers 16, the wavelength of the optical signal is large relative to the thickness of the insulating material, such that the signal strength is insufficient to precisely detect removal of the insulating material.

While such commercial OES and optical reflection systems are generally capable of precise etch control, as devices continue to be scaled to smaller dimensions and layer thickness decrease, even more etching endpoint control precision is needed.

SUMMARY

In one embodiment, a method for etching a thin film includes providing a substrate having a thin film layer thereon and etching the thin film layer, while monitoring the removal of an endpoint detection layer. The endpoint detection layer is located remotely from the substrate. The etching is stopped when a predetermined amount of the endpoint detection layer has been removed.

In another embodiment, a method for etching a thin film includes providing a plasma etching apparatus having a process chamber equipped with an optical endpoint detection device. An optical layer is formed on at least a portion of the process chamber. A device substrate having the thin film thereon is placed in the process chamber and the thin film is etched, while monitoring the optical layer with the endpoint detection device. The etching is terminated upon command from the endpoint detection device.

In yet another embodiment, a method for fabricating a semiconductor device includes forming a gate electrode on a gate dielectric layer overlying a substrate. A spacer material is formed on the gate electrode and the substrate is placed in an etching chamber. The spacer material is etched using an etching process to form sidewall spacers on sidewalls of gate electrode. An endpoint of the etching process is determined by monitoring the removal of a material layer from a surface of the etching chamber.

DETAILED DESCRIPTION

Figure 1:
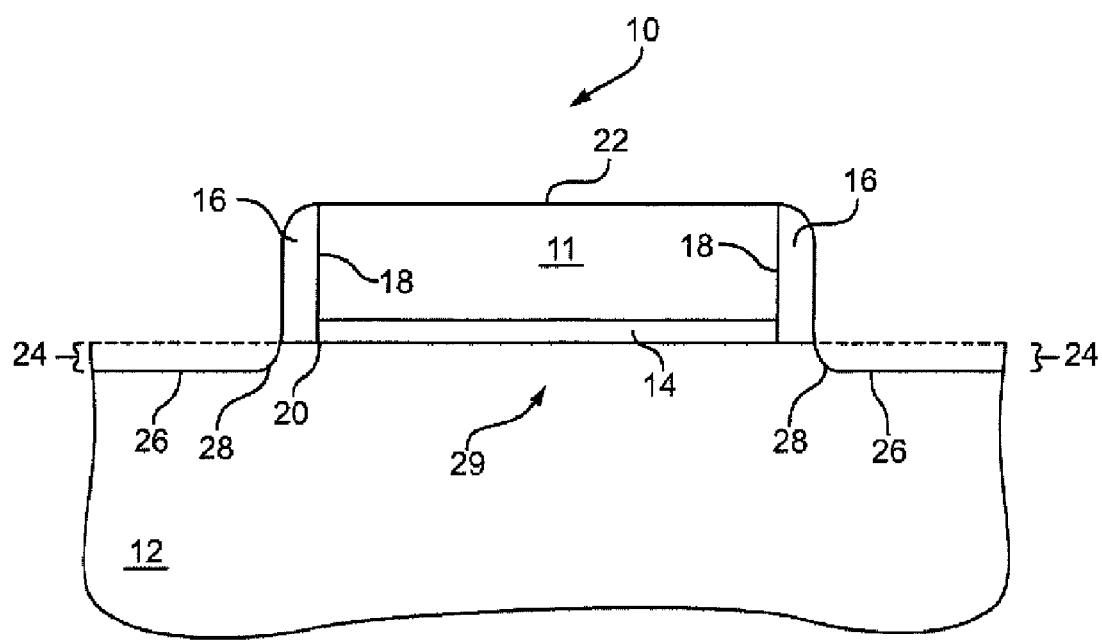
FIG. 1 illustrates, in cross-section, a portion of a semiconductor device fabricated with a prior art etching process.
Figure 2:
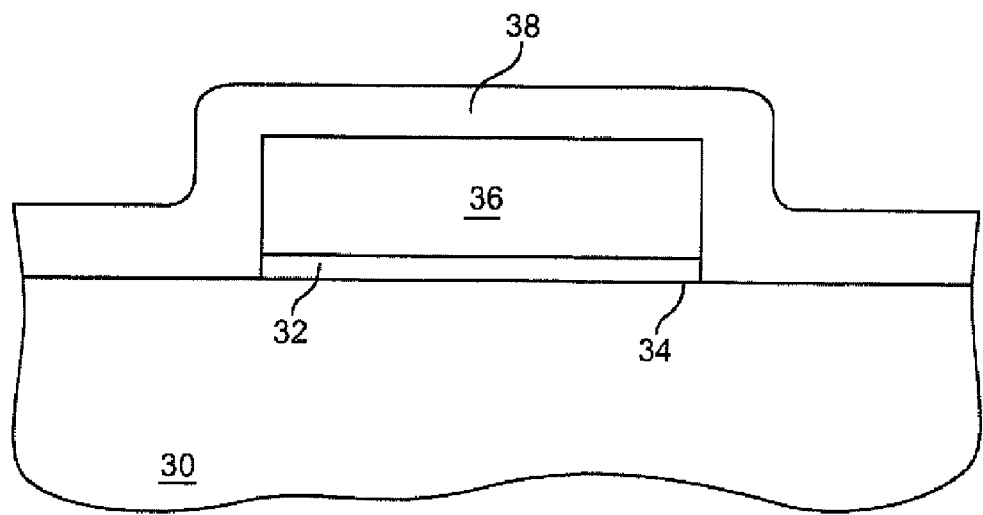
FIGS. 2 and 3, illustrate, in cross-section, a fabrication process in accordance with an aspect of the invention.

Illustrated in FIG. 2, in cross-section, is a semiconductor substrate 30 having already undergone several processing steps in accordance with the invention. A gate dielectric layer 32 overlies a principal surface 34 of substrate 30. A gate electrode 36 overlies principal surface 34 and is separated therefrom by gate dielectric layer 32. An insulating layer 38 is conformally deposited to overlie gate dielectric layer 32 and portions of a principal surface 34 exposed by gate electrode 36. Insulating layer 38 is formed of an insulating material that is differentially etchable with respect to substrate 30 and the material of gate electrode 36. For example, where substrate 30 is a silicon substrate and gate electrode 36 is polycrystalline silicon, insulating layer 38 is a silicon oxide layer deposited by low temperature chemical vapor deposition (CVD). Ideally, the etching plasma should not excessively react with the material of principal surface 34, however, because etching selectivity is not perfect, some etching of principal surface 34 is unavoidable, absent highly precise endpoint detection.

Figure 3:
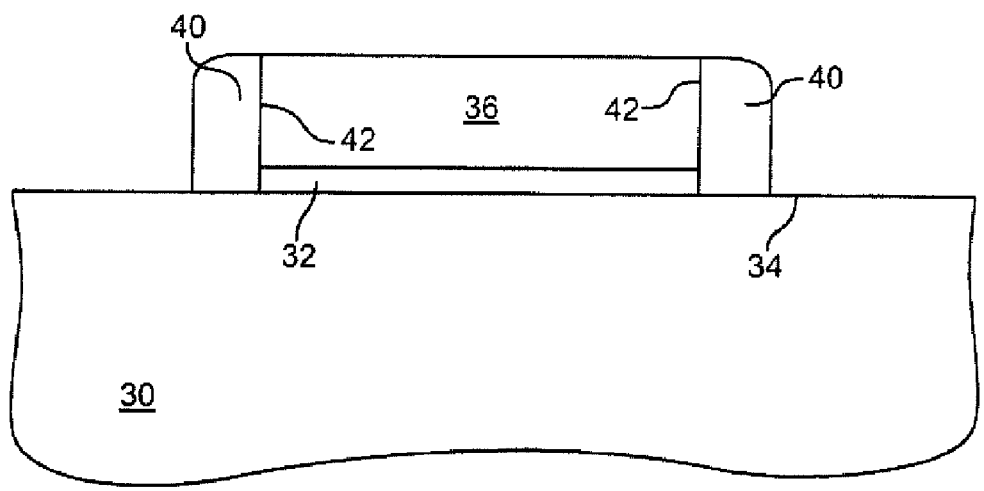

Following the formation of insulating layer 38, the insulating material is anisotropically etched to form sidewall spacers 40 adjacent to vertical edges 42 of gate electrode 36. In accordance with an aspect of the invention, as illustrated in FIG. 3, the etching process removes the portions of insulating layer 38, while substantially avoiding the etching of principal surface 34. In contrast to etching methods of the prior art, principle surface 34 of substrate 30 remains substantially unetched. In accordance with an aspect of the invention, the anisotropic etching process is carried out using an endpoint detection system that measures the removal of a thin film from an interior surface of the etching apparatus.

Figure 4:
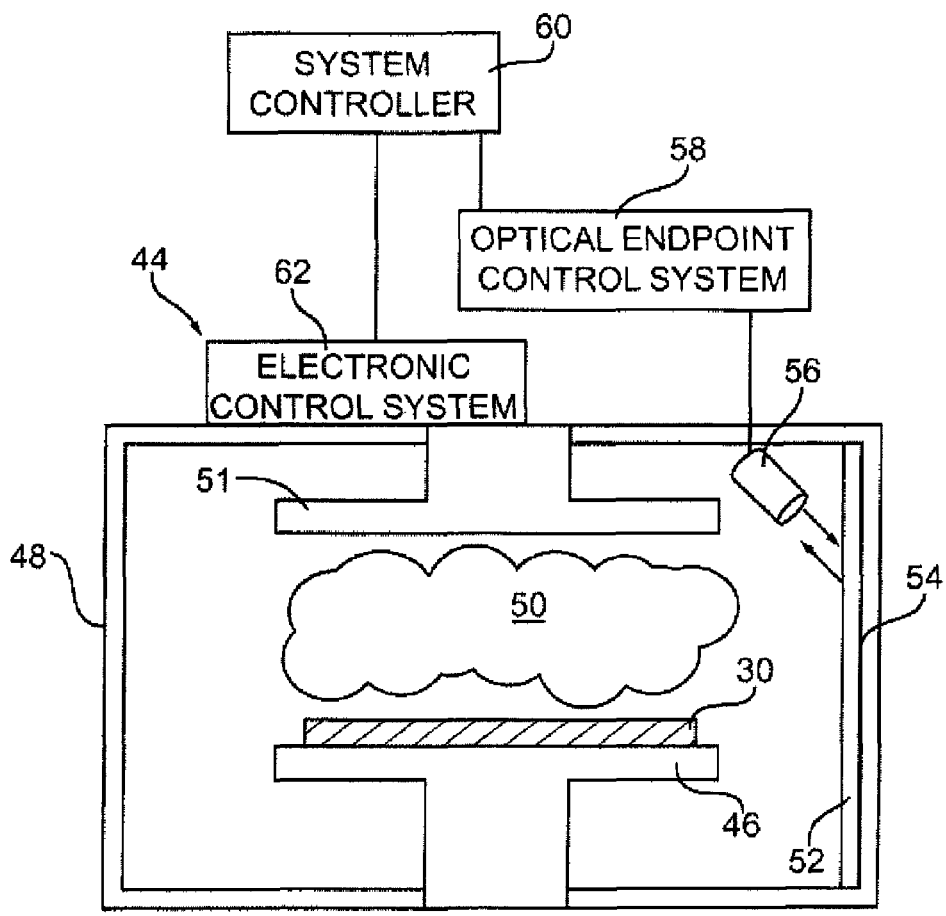
FIG. 4 is an exemplary schematic drawing of an etching apparatus useful for carrying out an etching process in accordance with an aspect of the invention.

Illustrated in FIG. 4 is a schematic sectional view of a parallel plate etching apparatus 44 arranged in accordance with one aspect of the invention. To carry out the etching process illustrated in FIG. 3, semiconductor substrate 30 is placed on an etching platform 46 within an etched chamber 48. A plasma 50 is generated within etched chamber 48 by applying RF power to one or both of an upper electrode 51 and etched platform 46, which also functions as a lower electrode. A suitable plasma is formed by introducing selected etching gases into etched chamber 48, such that plasma 50 will selectively etch the insulating material of insulating layer 38. Those skilled in the art will recognized that a variety of etched gases can be selected depending upon the particular composition of the insulating material to be etched. For example, halogens and halogenated hydrocarbon gases can be used to etch silicon oxide insulating the materials.

In accordance with an aspect of the invention, an endpoint detection layer 52 is coated on at least a portion of an inner surface 54 of etched chamber 48. During the etching process, a detector 56 optically monitors the thickness of endpoint detection layer 52 as the etching process is carried out. Detector 56 is electrically coupled to an optical endpoint control system 58, which is, in turn, electrically coupled with system controller 60 of etching apparatus 44. At the point where all or a predetermined portion of endpoint detection layer 52 is removed, endpoint control system 58 signals system controller 60 to terminate the RF power to etch chamber 48. Upon receiving the endpoint detection signal from endpoint control system 58, system controller 60 activates various circuits within an electronic control system 62 that controls numerous parameters including vacuum pressure, chamber temperature, gas flow aids, RF power systems, and the like.

Figure 5:
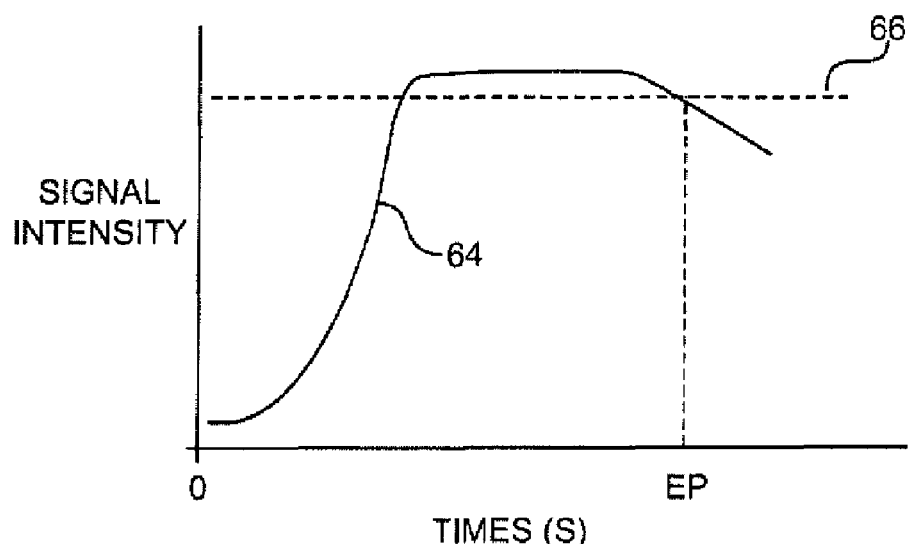
FIG. 5 is a plot of optical signal strength versus time for the removal of an endpoint detection layer prepared in accordance with an aspect of the invention.

As illustrated in FIG. 5, a signal intensity versus time plot can be generated that shows the output of detector 56 at various times during the etching process. In the exemplary plot of FIG. 5, a signal intensity 64 is seen to rapidly increase at the beginning of the etch process until it exceeds a predetermined calibration maximum 66. The signal intensity then remains substantially level until such time as the material of endpoint detection layer 52 is substantially removed from inner surface 64 of etched chamber 58. At time EP signal intensity 64 abruptly drops below calibration maximum 66, at which point the etching of insulating layer 38 on semiconductor substrate 30 is terminated.

Accordingly, the inventive etching method operates to precisely control the etching of a material layer on a substrate, while monitoring the removal of a film at a location remote from the substrate. The remote location of the material layer or endpoint detection layer can be relatively close to the substrate in the same etching chamber as the substrate, or greatly removed from the vicinity of the substrate, such as in a separate etching chamber. The optical endpoint control system and detector mechanism are designed to precisely control the etching process through a calibration methodology in which the removal of endpoint detection layer 52 is correlated with the etching of a material layer on a substrate.

In one exemplary embodiment, endpoint detection layer 52 is formed by depositing a polymer material on at least a portion of an inner surface of etched chamber 48. The polymer material can be one of a number of different types of polymers and copolymers. Those skilled in the art will recognize that numerous types of materials can be used to form thin film 54 depending upon the particular etching characteristics of the material to be etched on substrate 30.

In one form, endpoint detection layer 52 is a fluorinated polymer or co-polymer containing carbon and fluorine atoms. Preferably, endpoint detection layer 52 is a carbon-based polymer layer. Carbon based polymer materials have the advantage of being easily removed by oxygen. The carbon-based polymer material may be formed using a plasma comprising one or more $C_xH_yF_z$ gases, such as, but not limited to, $CF_4$, $CH_2F_2$, $CHF_3$, and $CH_4$. The $C_xH_yF_z$ gases may also be mixed with other gases used for coating the chamber wall such as $SiCl_4$. In one specific embodiment, where the thin film layer being etched is a low temperature silicon oxide, $CF_4$ and $CH_2F_2$ gases are used to form the endpoint detection layer 52.

Those skilled in the art will appreciate that in semiconductor fabrication, numerous substrates are processed in a sequential fashion in a single etching reactors. Periodic cleaning is necessary to condition the reaction chamber prior to etching substrates. Further, in the inventive endpoint detection method, the condition of the etching chamber walls are preferably maintained in order to insure that the thickness of the endpoint detection layer is controlled. In one aspect of the invention, the chamber walls are pre-cleaned prior to depositing endpoint detection layer 52. The pre-clean process is carried out using oxygen ($O_2$) introduced at about 50 to 300 standard-cubic-centimeters-per minute (sccm) and an $O_2$ plasma is formed by applying about 500-2000 watts for a sufficient amount of time to remove residual material from the chamber walls.

Although the foregoing description has been set forth with respect to the etching of a silicon oxide insulating material, numerous other types of insulating materials are widely used in semiconductor technology, including silicon nitride, silicon oxynitride, ceramic materials, high-k dielectric materials, boron or phosphorous-containing insulating materials, and the like. Accordingly, the particular material that is used as an endpoint detection layer in etching apparatus 44 will vary depending upon the particular plasma etched characteristics of the etched layer.

Further, although a parallel plate etching chamber configuration is schematically illustrated in FIG. 4, numerous other types of etching apparatus configurations can be used with the present invention. For example, downstream etching reactors, electron-cyclotron-resonance (ECR) etching systems, multi-chambered etching systems, and the like, can be used. Further, although the endpoint detection layer is illustrated as endpoint detection layer 52 on an inner surface of an etching chamber. As described above, the endpoint detection layer can be positioned in a chamber different from that in which the substrate is placed. For example, the etching gases can be introduced into a separate chamber having the endpoint detection layer formed on some portion thereof, and the thin film etching process takes place in a different chamber, but is controlled by the etching of the endpoint detection layer in the separate chamber. Further, all or only a portion of the inner walls of the etch chamber can be coated with the endpoint detection layer.

Importantly, the inventive process enables the formation of sidewall spacers, such as sidewalls spacers 40 without degrading principle surface 34 of substrate 30. By avoiding the formation recesses in the substrate, improved device performance is obtained through fabrication of devices employing the inventive etching process.

Although one exemplary process for etching an insulating layer to form sidewall spacers is described above, the inventive method is not limited to the formation of sidewall spacers. The method can be used to etch any thin film material. In alternative methods, the etch rate of the given thin film material is correlated to the removal rate of a selected endpoint detection material.

Using the forgoing description, those skilled in the art can fully practice the various aspects of the invention. The following example is merely illustrative of one aspect of the invention and is not meant to limit the invention in any way whatsoever.

EXAMPLE

An etching apparatus is provided and a chamber conditioning process is carried out to form an endpoint detection layer on the inner surface of the etching chamber. The process is carried out by conditioning the chamber using a chamber stabilization process for about 10 to about 60 seconds at a pressure of about 5 to about 30 mT and introducing about 50 to about 400 sccm of $O_2$. In a second stage, the conditioning processes is continued for about 10 to about 200 seconds at a pressure of about 5 to about 30 mT and with about 50 to about 400 sccm $O_2$ and a power level of about 500 to about 2000 watts. Next, an endpoint detection layer is formed on the chamber walls by a five seconds process at a pressure of about 10 to about 150 mT with a power level of about 500 to about 2000 watts with about 5 to about 80 sccm CF4 and about 10 to about 200 sccm of CH2F2 after flowing the chamber at a pressure of about 5 to about 200 mT with about 5 to about 100 sccm of $CF_4$ and about 20 to about 200 sccm of $CH_2F_2$ for about 5 to about 30 seconds.

In order to compare the amount of silicon substrate etching using a convention process with that obtained using the inventive etching process, an experiment was carried out using two wafers with an equivalent film stack, including an insulating layer overlying a silicon substrate and a gate electrode.

Figure 6:
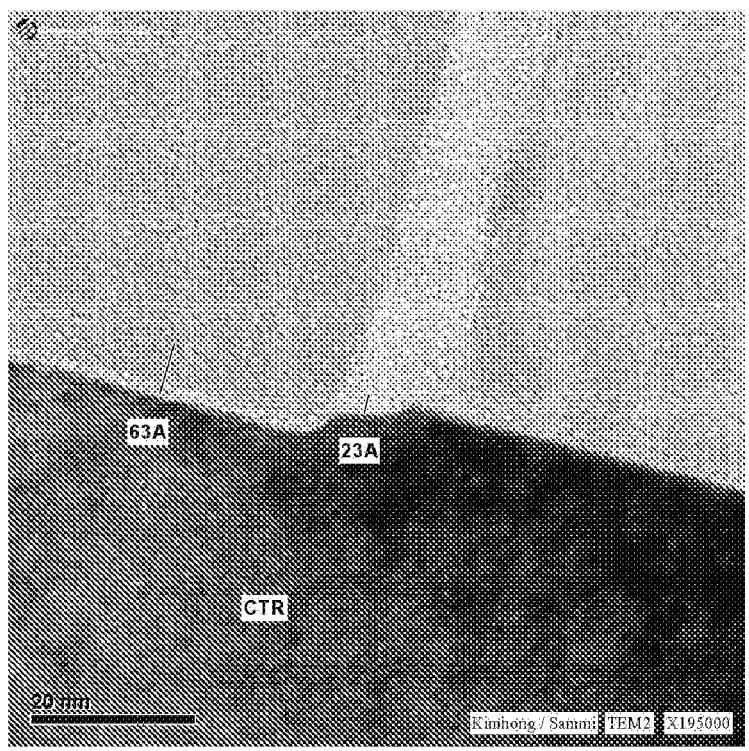
FIG. 6 illustrates a micrograph of a silicon substrate surface adjacent a gate electrode after etching an overlying insulating layer in accordance with a prior art method, the figure also shows an endpoint signal plot generated during the etch by a convention endpoint method.
Figure 6:
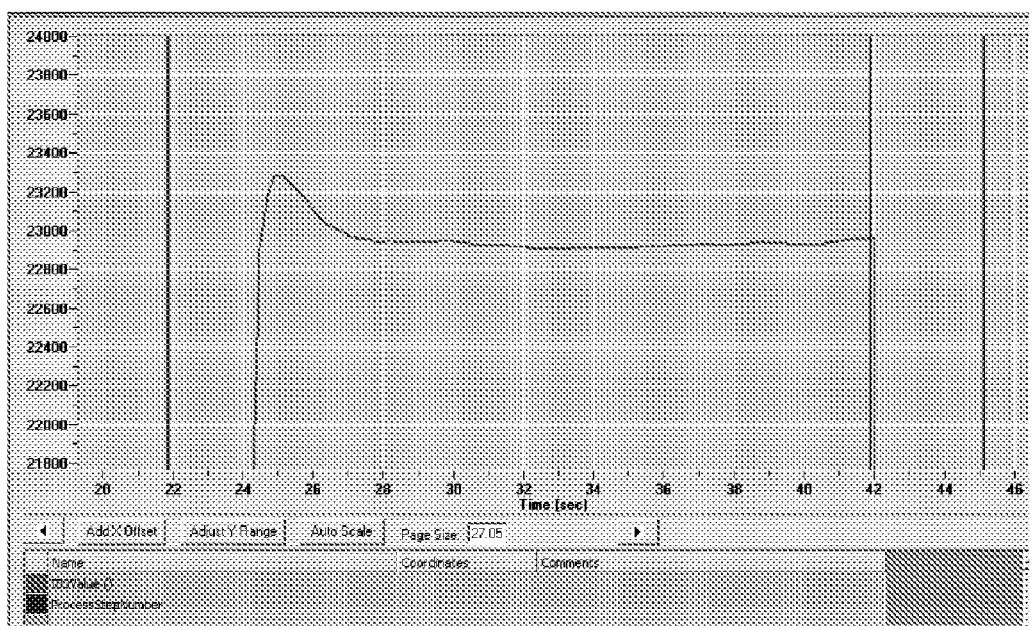

Upon etching one of the wafers using a conventional OES endpoint process, a 40 angstrom recess of the silicon surface was observed as illustrated in the micrograph of FIG. 6. An endpoint signal plot is also provided in FIG. 6 showing the endpoint signal from the conventional system during etching of the insulating layer. As shown by the endpoint signal, when the convention etching process removed the insulating layer and exposed the underlying silicon substrate, the signal strength changed by only about a 2 percent (%).

Figure 7:
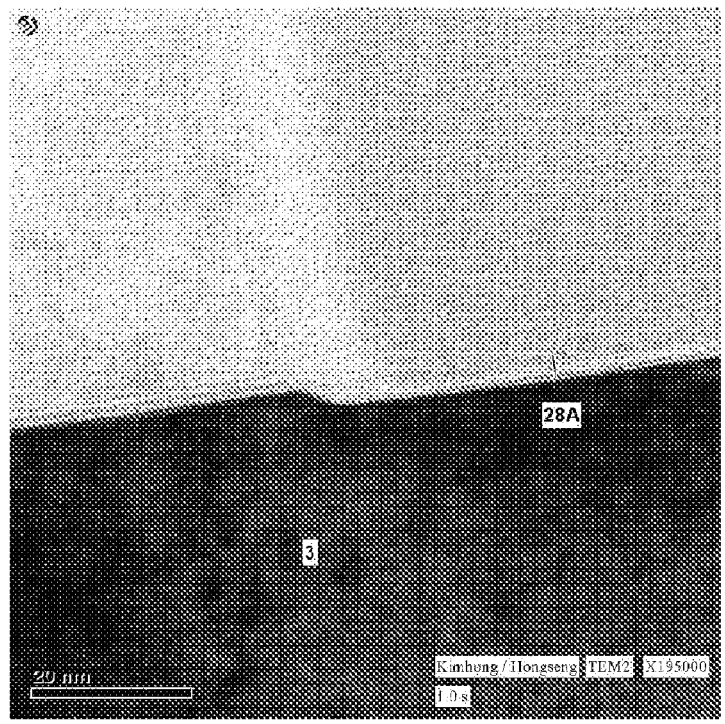
FIG. 7 illustrates a comparative micrograph and endpoint signal plot for an etching method in accordance an aspect of the invention.
Figure 7:
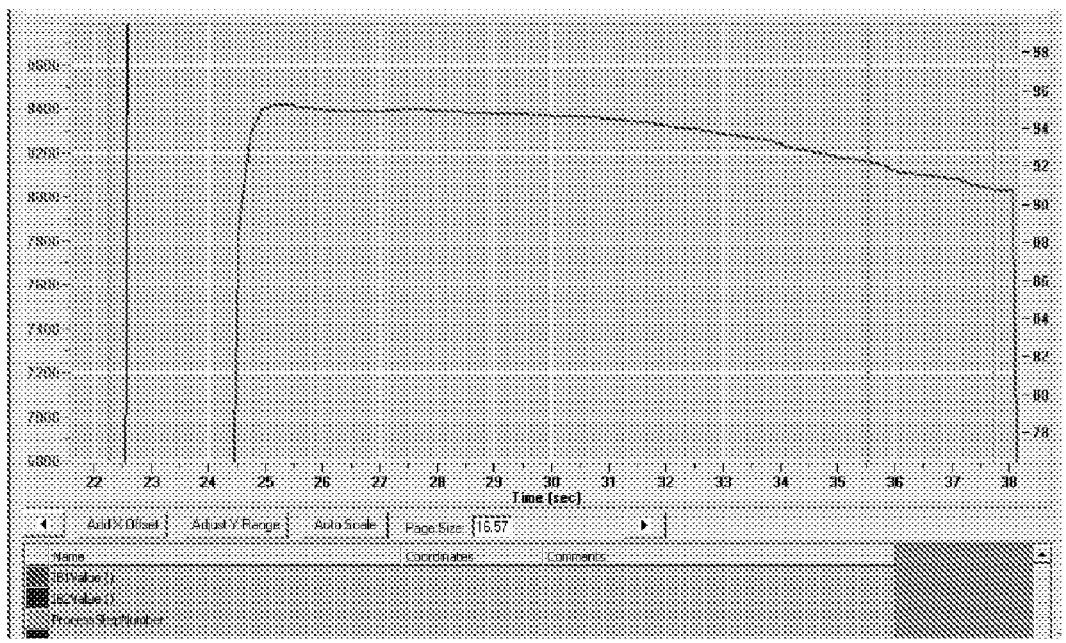

Upon etching the other wafer using the inventive etching process described above, a 5 angstrom recess of the silicon surface was observed as illustrated in the micrograph of FIG. 7. An endpoint signal plot is also provided in FIG. 7 showing the endpoint signal from the inventive process during etching of the insulating layer. Significantly, the endpoint signal plot shows about a 5% to 10% change in signal strength when the inventive etching process removed the insulating layer and exposed the underlying silicon substrate.

Accordingly, by selecting an endpoint detection film that has an etch rate correlated with the etch rate of the thin film layer being etched, and which also exhibits a more significant change in etch signal, the amount of substrate recessing can be reduced. In the example described above, less than 5 angstroms of silicon was removed by the inventive etching process, versus 40 angstroms by the conventional etching process.

Thus, it is apparent that there has been described in accordance with various embodiments of the invention, a method for etching a thin film and fabricating a semiconductor device that provides the advantages set forth above. Those skilled in the art will appreciate that variations and modifications can be made without departing from the scope of the invention. For example, numerous pre-treatment processes can be used to prepare the surface of a thin film that is to be etched. Further, multi-stage etching processes can be used in which only a portion of a single thin film layer is etched in a first stage, followed by the etching of remaining portions of the thin film layer in subsequent etching stages. Accordingly, all such variations and modifications are included within the appended claims and equivalence thereof.

The invention claimed is:

1. A method for etching a thin film, the method comprising:
providing a substrate having a thin film layer thereon;
etching the thin film layer on the substrate, while monitoring the removal of an endpoint detection layer located remotely from the substrate; and
stopping the etching when a predetermined amount of the endpoint detection layer has been removed.

2. The method of claim 1 further comprising forming an endpoint detection layer and correlating an etch rate of the endpoint detection layer to an etch rate of the thin film layer and depositing the endpoint detection layer on the surface of an etching chamber to a thickness determined by the etch rate correlation.

3. The method of claim 1, wherein monitoring the removal of the endpoint detection layer comprises monitoring by optical emission spectroscopy.

4. The method of claim 2, wherein forming an endpoint detection layer comprises forming a polymer layer.

5. The method of claim 4, wherein monitoring the removal of an endpoint detection layer comprises monitoring the removal of a polymer including fluorine.

6. The method of claim 1, wherein providing a substrate having a thin film layer thereon comprises providing a substrate having a dielectric layer thereon.

7. The method of claim 6, wherein providing a substrate comprises providing a silicon substrate.

8. The method of claim 1, wherein etching the thin film layer comprises forming sidewall spacers on a gate electrode.

9. The method of claim 8, wherein forming sidewall spacers on a gate electrode comprises forming silicon oxide spacers on a polycrystalline silicon gate electrode.

10. A method for etching a thin film, the method comprising:
    providing a plasma etching apparatus having a process chamber equipped with an optical endpoint detection device;
    forming an optical layer on at least a portion of the process chamber;
    placing a device substrate having the thin film thereon in the process chamber and etching the thin film, while monitoring the optical layer with the endpoint detection device; and
    terminating the etching upon command from the endpoint detection device.

11. The method of claim 10, wherein forming an optical layer comprises forming the optical layer during a chamber pre-conditioning process.

12. The method of claim 10, wherein terminating the etching upon command from the endpoint detection device comprises receiving an optical endpoint signal and terminating the etching upon detecting an abrupt change in the optical endpoint signal.

13. The method of claim 10, wherein forming an optical layer comprises forming a polymer layer.

14. The method of claim 13, wherein forming a polymer layer comprises forming a polymer including fluorine.

15. The method of claim 10, wherein etching the thin film comprises etching a dielectric layer on the device substrate.

16. The method of claim 15, wherein etching a dielectric layer comprises forming a sidewall spacer on a gate electrode.

17. The method of claim 16, wherein placing a device substrate in the process chamber comprises placing a silicon substrate in the process chamber, and wherein forming a sidewall spacer on a gate electrode comprises forming a silicon oxide spacer on a polycrystalline silicon gate electrode.

18. A method for fabricating a semiconductor device, the method comprising:
    forming a gate electrode on a gate dielectric layer overlying a substrate;
    forming a spacer material on the gate electrode; and
    placing the substrate in an etching chamber and etching the spacer material using an etching process to form sidewall spacers on sidewalls of gate electrode,
    wherein an endpoint of the etching process is determined by monitoring the removal of a material layer from a surface of the etching chamber.

19. The method of claim 18, wherein forming a gate electrode on a gate dielectric layer overlying a substrate comprises forming a silicon oxide layer overlying a silicon substrate, and wherein forming a spacer material on the gate electrode comprises forming a low temperature oxide material on a polycrystalline silicon gate electrode.

20. The method of claim 18 further comprising correlating an etch rate of the material layer to an etch rate of the spacer material and depositing the material layer on the surface of the etching chamber to have a thickness determined by an etch rate ratio of the material layer and the spacer material.

21. A method for controlling the etching a thin film having a predetermined thickness, the method comprising:
    forming an endpoint detection layer on at least a portion of an inner surface of a plasma etching apparatus,
    wherein a thickness of the endpoint detection layer is correlated with the predetermined thickness of the thin film;
    etching the thin film and the endpoint detection layer in the plasma etching apparatus, while monitoring the endpoint detection layer; and
    stopping the etching when a predetermined amount of the endpoint detection layer has been removed.

22. The method of claim 21, wherein forming an endpoint detection layer comprises forming a polymer layer.

23. The method of claim 21, wherein monitoring the endpoint detection layer comprises monitoring an optical reflection endpoint detection layer.

24. The method of claim 21 further comprising cleaning the inner surface of a plasma etching apparatus prior to forming an endpoint detection layer.

* * * * *